US009047423B2

(12) United States Patent
Tesauro et al.

(10) Patent No.: US 9,047,423 B2
(45) Date of Patent: Jun. 2, 2015

(54) MONTE-CARLO PLANNING USING CONTEXTUAL INFORMATION

(75) Inventors: Gerald J. Tesauro, Croton-on-Hudson, NY (US); Alina Beygelzimer, White Plains, NY (US); Richard B. Segal, Chappaqua, NY (US); Mark N. Wegman, New Castle, NY (US)

(73) Assignee: INTERNATIONAL BUSINESS MACHINES CORPORATION, ARMONK, NY (US)

(*) Notice: Subject to any disclaimer, the term of this patent is extended or adjusted under 35 U.S.C. 154(b) by 422 days.

(21) Appl. No.: 13/348,993

(22) Filed: Jan. 12, 2012

(65) Prior Publication Data
US 2013/0185039 A1    Jul. 18, 2013

(51) Int. Cl.
*G06F 17/50*    (2006.01)

(52) U.S. Cl.
CPC .................................. *G06F 17/5018* (2013.01)

(58) Field of Classification Search
CPC ... G06F 11/14; G06F 11/1645; G06F 11/188; G06F 15/76; G06F 9/46; G06F 9/50; G06Q 10/04; G06Q 10/06; G06Q 40/08; G06Q 40/00; G06Q 40/06; G06Q 50/188; G06Q 50/22; G06Q 50/24; G07F 17/32; G01S 1/026; G01S 1/028; G01S 2205/006; G01S 2205/008; G01S 5/0009; G01S 5/0018; G01S 5/0054; G01S 5/02; G01S 5/0205; G01S 5/021; G01S 5/0252; G01S 5/06; G01S 5/0257; G01S 5/0278
USPC ............. 703/6, 2, 22; 709/223–226; 718/104, 718/105; 716/53
See application file for complete search history.

(56) References Cited

U.S. PATENT DOCUMENTS

| | | | | |
|---|---|---|---|---|
| 7,805,407 | B1* | 9/2010 | Verbeke et al. | 707/634 |
| 8,001,063 | B2* | 8/2011 | Tesauro et al. | 706/12 |
| 8,060,454 | B2* | 11/2011 | Das et al. | 706/12 |
| 8,099,319 | B2* | 1/2012 | Mathews et al. | 705/7.29 |
| 8,265,982 | B2* | 9/2012 | Mathews et al. | 705/7.29 |
| 8,392,236 | B2* | 3/2013 | Fung et al. | 705/7.27 |

(Continued)

OTHER PUBLICATIONS

Barret H., Howland, F.M., Introductory Econometrics: Using Monte Carlo Simulation with Microsoft Excel, Cambridge University Press, 2006.*

(Continued)

*Primary Examiner* — Kamini S Shah
*Assistant Examiner* — Scott S Cook
(74) *Attorney, Agent, or Firm* — Scully, Scott, Murphy & Presser, P.C.; Daniel P. Morris, Esq.

(57) ABSTRACT

A method, system and computer program product for choosing actions in a state of a planning problem. The system simulates one or more sequences of actions, state transitions and rewards starting from the current state of the planning problem. During the simulation of performing a given action in a given state, a data record is maintained of observed contextual state information, and observed cumulative reward resulting from the action. The system performs a regression fit on the data records, enabling estimation of expected reward as a function of contextual state. The estimations of expected rewards are used to guide the choice of actions during the simulations. Upon completion of all simulations, the top-level action which obtained highest mean reward during the simulations is recommended to be executed in the current state of the planning problem.

16 Claims, 6 Drawing Sheets

(56) References Cited

U.S. PATENT DOCUMENTS

| | | | |
|---|---|---|---|
| 8,417,613 B1* | 4/2013 | Ross | 705/36 R |
| 2005/0172291 A1* | 8/2005 | Das et al. | 718/104 |
| 2005/0209059 A1* | 9/2005 | Crawford et al. | 482/54 |
| 2007/0156555 A1* | 7/2007 | Orr | 705/35 |
| 2007/0203871 A1* | 8/2007 | Tesauro et al. | 706/53 |
| 2008/0263559 A1* | 10/2008 | Das et al. | 718/104 |
| 2009/0099946 A1* | 4/2009 | Kelley | 705/35 |
| 2010/0191632 A1* | 7/2010 | Hogan et al. | 705/35 |
| 2010/0228854 A1* | 9/2010 | Morrison et al. | 709/224 |
| 2010/0312530 A1* | 12/2010 | Capriotti | 703/2 |
| 2011/0138055 A1* | 6/2011 | Daly et al. | 709/226 |
| 2012/0079497 A1* | 3/2012 | Gangemi et al. | 718/104 |

OTHER PUBLICATIONS

Makhost, H., Muller, M., Monte-Carlo Search for Deterministic Planning, Association for the Advancement of Artificial Intelligence, 2010.*

Nakhost, H., Muller, M., Monte-Carlo Exploration for Deterministic Planning, Proceedings of the Twenty-First International Joint Conference on Artificial Intelligence (IJAI-09), 2009, pp. 1766-1771.*

Gelly, S., Silver, D., Achieving Master Level Play in 9×9 Computer Go, Proceedings of the Twenty-Third AAAI Conference on Artificial Intelligence, 2008 pp. 1537-1540.*

Vuckovic, V., Solak, R., Time Management Procedure in Computer Chess, Automatic Control and Robotics vol. 8, No. 1, 2009 pp. 75-87.*

Justiniano, C., ChessBrian: a Linux-Based Distributed Computing Experiment, LINUX Journal Online, Sep. 1, 2003 [retrieved on Jan. 14, 2014] downloaded from http://www.linuxjournal.com/article/6929.*

Silver, D., Monte-Carlo Simulation Balancing, Department of Computer Science College London, 26th International Conference on Machine Learning (ICML) Montreal 2009, [retrieved online Jan. 14, 2014] downloaded from http://videolectures.net/icml09_silver_mcsb/http://videolectures.net/icml09_silver_mcsb/.*

Guttag, J., Lecture 14: Sampling and Monte Carlo Simulation, Department of Electrical and Computer Science, MIT, Introduction to Computer Science and Programming, Spring 2011, Mar. 2011, [retrieved online Jan. 14, 2014] downloaded from http://videolectures.net/mit600SCs2011_guttag_lec14/?ref=r00:10: [5537,15791,9937,10892,3464,6407,589,15542,15685,1804.*

Silver, D., Tesauro, G., Monte-Carlo Simulation Balancing, International Conference on Machine Learning, Montreal, Canada, 2009.*

Graf et al. Parallel Monte-Carlo Tree Search for HPC Systems, Proc. 17$^{th}$ International Euro-Par Conference on Parallel PRocessing (2011), pp. 365-376.*

Tesauro et al. Bayesian Inference in Monte-Carlo Tree Search, Proc. Conf. Uncertaint Artif. Intell., pp. 580-588 2010.*

Longstaff, F.A. Schwartz, E.S., Valuing American Options by Simulation: A Simple Least-Squares Approach, The Review of Financial Studies, 2001, vol. 14, No. 1, pp. 113-147.*

Haugh, M.B., Kogan, L., Pricing American Options: A Duality Approach, Dec. 2001, Operations Research Center, MIT.*

Magoules, F., Introduction to Grid Computing, 2009 Taylor & Francis Group, LLC, CRC Press, A Chapman & Hall Book.*

* cited by examiner

FIG. 5 though the data structure 400 depicts a current state of an
MONTE-CARLO PLANNING USING CONTEXTUAL INFORMATION

BACKGROUND

The present disclosure generally relates to systems and methods for planning and sequential decision making, for example, in real-world domains. More particularly, the present application relates to planning via Monte-Carlo simulation trials utilizing an innovative decomposition of observable state information that enables tackling larger state spaces than is feasible with established state-of-the-art methods.

A planning problem, also known as a sequential decision-making problem, is commonly characterized by a set of possible states of the problem, a set of allowable actions that can be performed in each state, a process for generating transitions to successor states given the current state and current selected action, a planning horizon (i.e., total anticipated number of decisions to be made in the problem), and a measure of utility or reward obtained at one or more steps of the planning problem. Typically, the objective is to compute a sequence of decisions that maximizes expected cumulative discounted or undiscounted reward. Additionally, planning problems presume that observable information pertaining to the state of the problem is available at each step in the sequence. If the observable information uniquely identifies the state, and the processes that generate rewards and state transitions are stationary and history-independent, the problem is formally classified as a Markov Decision Process (MDP). Alternatively, if the observable information does not uniquely identify the state, the problem is a Partially Observable Markov Decision Process (POMDP), provided that the reward and state transition processes are still stationary and history-independent.

Monte-Carlo Planning methods use a simulation model of the real domain, and estimate the cumulative reward of performing an action in a given state on the basis of Monte-Carlo simulation trials. Such simulation trials comprise one or more steps, each of which typically comprises a simulation of performing an action in the current simulated state, generating a transition to a new state, and generating an immediate reward (if applicable). The selection of an action at each step is performed by a simulation policy, i.e., a method which selects one of the available legal actions responsive to information observed in the current or previous steps of a simulation trial. The outcomes of Monte-Carlo simulation trials are assumed to be non-deterministic. The non-determinism may arise from non-deterministic rewards or state transitions, as well as from the use of a non-deterministic simulation policy. As a result, Monte-Carlo simulation trials provide a means of statistically evaluating the long-range cumulative expected reward obtained by performing a given action in a given state of the simulated domain.

Many methods are known in the art for planning based on Monte-Carlo simulation trials. One of the earliest and simplest methods is the so-called "rollout algorithm" (G. Tesauro and G. R. Galperin, On-line policy improvement using Monte-Carlo search," in: Advances in Neural Information Processing Systems, vol. 9, pp. 1068-1074, 1997). In this method, a number of simulated trials ("rollouts" are performed, each starting from a common initial state corresponding to the current state of the real domain. Each trial comprises selection of a legal action in the root state according to a sampling policy, and then actions in subsequent steps of the trial are performed by a fixed simulation policy. Mean reward statistics are maintained for each top-level action, and upon termination of all simulated trials, the method returns the top-level action with highest mean reward to be executed in the real domain.

More recently, a number of Monte-Carlo planning methods have been published (e.g., L. Kocsis and Cs. Szepesvari, "Bandit-based Monte-Carlo Planning," Proceedings of European Conference on Machine Learning, pp. 282-293, 2006) that extend the rollout algorithm to multiple levels of evaluation. That is, mean reward statistics are computed and maintained at subsequent steps of a trial in addition to the top-level step. This is typically accomplished by maintaining a collection of "nodes" (i.e., symbolic representations of states, or legal actions in a given state) encountered during the trials, computing total reward at the end of each trial, and then updating mean reward statistics of nodes participating in a given trial based on the total reward obtained in the trial. A sampling policy (e.g., sampling according to multi-armed bandit theory) is used not only for the initial step, but also for subsequent steps of a trial. While these methods are capable of producing effective sequential plans in domains with arbitrary topological relations between nodes (e.g., general MDPs with multiple paths to a given state, and loops back to previously encountered states), the preferred embodiment of these methods comprises nodes organized in a strict tree structure. For this reason, the methods are commonly referred to as Monte-Carlo Tree Search (MCTS) methods.

The recent advances in the use of MCTS methods enable effective on-the-fly planning in real-world domains such as Computer Go (S. Gelly and D. Silver, "Achieving Master Level Play in 9×9 Computer Go," Proc. of AAAI, 2008). In that MCTS method, a tree of alternating action (parent) nodes and child nodes based on a simulated game is dynamically grown. The MCTS tree and data associated with nodes are represented as data structures in a computer system memory. From stochastic simulations involving randomness of sequential game moves (e.g., simulations of playouts in the case of Computer Go), intelligence is gathered at each of the nodes (e.g., an evaluation based on a winning percentage). For example, in the case of Computer Go, statistics data at each node is maintained based on the number of trials and simulated playout win outcomes. Associated reward values may be computed and stored in association with that node of the tree. On the basis of the intelligence gathered from the simulations, a good strategy for a player's move (decisions) can be inferred.

Figure 1:
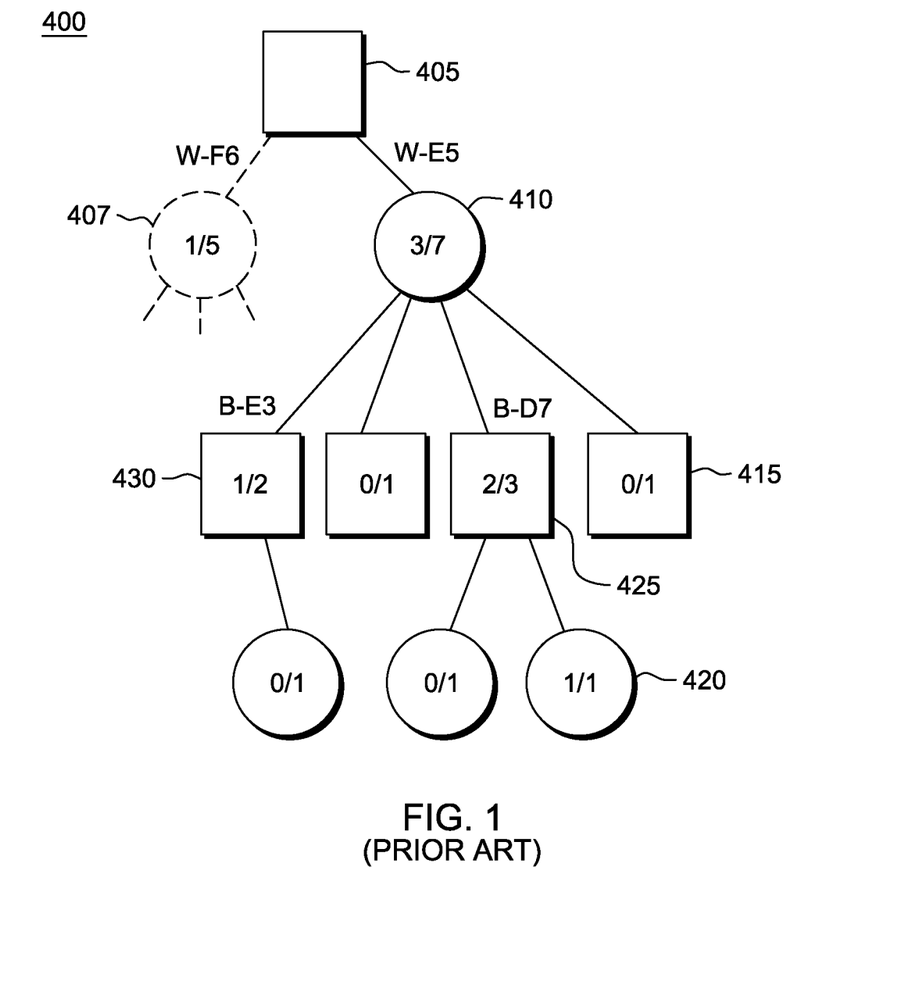
FIG. 1 is an exemplary tree structure portion that includes an alternating structure of action nodes and successor state nodes representing an MCTS approach for planning according to existing implementations.

FIG. 1 illustrates a data structure 400 constructed by a computing system for computing the optimal move for one player (for example, White) in an example computer Go game. The data structure 400 depicts a current state of an example computer Go game, and includes a parent node 405, and an alternating tree structure of action nodes represented by circles (e.g., nodes 407, 410 and 420) and successor state nodes represented by squares (e.g., nodes 405, 415, 425 and 430). An action node refers to a node in the data structure 400 that specifies at least one next action for the planning agent to perform in the parent node state. For example, node 410 may represent the action of White playing at E5 in the root state, and node 407 may represent White playing at F6 in the root state. Successor state nodes indicate possible environmental responses to the planning agent's actions, for example, possible moves that can be made by Black in response to a particular move by White. For example, node 425 represents the response B-D7 to W-E5, and node 430 represents the response B-E3 to W-E5. Within the data structure, standard MCTS planning methods perform a plurality of trials for each top-level action. A trial comprises a sequence of simulation steps, each step comprising a selection of an action node from among the available actions, and simulating a response of the environment leading to a successor state. The selected actions in the initial steps of a trial are typically selected by a bandit-sampling policy. If the trial selects an action that has not been previously sampled, a new node will be added to the data structure, corresponding to the action, and steps of the trial will continue, making use of a non-deterministic "playout" policy to select moves for both players. The steps of the trial continue until the simulated game terminates according to the rules of Go.

As a result of the simulated actions according to the MCTS approach, the data maintained at each action node includes the total number of simulated trials including the given action node, and the number of trials resulting in a win outcome. For example, node 410 contains the data record "3/7" indicating that a total of 7 trials have been performed including this node, of which 3 trials resulted in wins for White. After completion of a trial, the MCTS approach performs an update, in which the statistics of the nodes participating in the trial are updated with the game results, i.e., results of simulated trials are propagated up successive levels of the tree.

The value of any given node is estimated according to the node's mean win rate, i.e., the ratio of number of wins to total number of trials including the given node. During the performance of simulated trials within a decision cycle, selecting actions according to mean win rate may result in greater likelihood of achieving a more favorable outcome. For example, at node 405, a root node representative of the current state of the game, there is estimated the expected reward of each child action node (e.g., value of 1/5 for node 407 and value of 3/7 for node 410 in FIG. 1). Based on the observed statistics, selecting action 410 will be more likely to achieve a win than action 407. In practice, bandit-sampling algorithms used in MCTS select actions in a manner that balances exploitation (achieving high win rate) and exploration (sampling nodes with few trials). The tree is expanded by one node for each simulated game and is grown dynamically by adding new leaf nodes and performing corresponding simulations.

While MCTS methods enable effective planning in many real domains, it is widely understood that the computational cost of such methods scales poorly (i.e., exponentially) with the number of state variables, the granularity of possible values of the state variables, and the number of legal actions in typical states. Consider, for example, domains comprising a number of continuous-valued state variables. A literal implementation of standard MCTS, maintaining separate nodes for each distinct state, may well result in no node being encountered more than once, since each encountered state may never match a previously encountered state to infinite precision in all state variables. Hence, the mean reward statistics in every node would only comprise results of a single trial, and would thus provide a highly unreliable estimate of a node's true expected value.

Discretizing the state space (of continuous variables) could address the above limitation of MCTS methods. For example, continuous robot arm motion may be discretized in units of 1 degree angles. However, the number of encountered states in the Monte-Carlo trials may still be infeasibly large, and the number of visits of any given node may still be too small to provide a reliable basis for effective planning. Moreover, such an approach fails to exploit a natural smoothness property in many real-world domains, in that similar states tend to have similar expected values, so that statistical evidence gathered from neighboring states could provide highly relevant evidence of the expected value of any particular node.

Hence, it would be desirable to provide a system and method implementing improved Monte-Carlo planning that reduces the nominal search complexity of standard Monte-Carlo Tree Search, and effectively exploits smooth dependence of expected cumulative reward on some or all of the observable state variables in a given real-word domain.

SUMMARY OF THE INVENTION

In one embodiment, there is provided a system, method and computer program product for performing Monte-Carlo planning of actions in a real-world environment. The method effectively exploits a suitable decomposition of the observable information pertaining to identification of the current state of the environment, and estimation of the state's expected cumulative reward. The decomposition partitions the observable information into two components: the first component is used to identify a base state, while the second component is used to identify a contextual state.

In preferred embodiments, each unique base state maps to a distinct and uniquely identifiable node in a forward-search planning graph, wherein search techniques known in the art (for example, MCTS-like techniques) may be employed for computing an optimal plan in a given base state. The nodes considered during operation of the search techniques, as determined by corresponding base states, are enumerable and manageable in number. The set of base state instances need not constitute a metric space (i.e., a distance measure is not required), and estimation of future reward in a given base state need not be amenable to regression techniques. Moreover, in stochastic simulations of trajectories starting from a given base state, at least some of the successor nodes in the search graph should be visited multiple times, so that accurate statistics on the expected reward in the nodes may be computed. Examples of base state descriptions include: a list of White and Black stone locations in a Go game; a list of buttons pressed in an elevator-dispatch application (hall buttons and destination buttons); a list of jobs currently running and jobs completed in a job-scheduling application.

On the other hand, instances of contextual state exhibit converse characteristics. The instances do not map to unique nodes in a search graph; they do comprise a metric space, and prediction of expected reward as a function of contextual state in a given base state node is amenable to regression techniques. Finally, specific instances of contextual state need not repeat over the course of multiple stochastic simulation trials. Examples of contextual state information include: amount of elapsed time on White and Black clocks in a timed Go game; time remaining until deadline in a job-scheduling application; and for each currently activated button in an elevator-dispatch application, a list of times elapsed since each button was pressed.

The system, method and computer program product construct data structures comprising representations of actions performed in a given state of the environment, and according to an improved Monte-Carlo planning approach, performs simulated trials using a simulation model of the environment in order to plan effective actions to take in a given state of the environment. The method constructs a collection of nodes in a base-state search space with a finite and manageable number of nodes, while utilizing the contextual-state information to estimate expected cumulative reward in a given node according to standard regression techniques known in the art, e.g., gradient methods for online learning and stochastic optimization.

In one aspect, there is provided a method for choosing actions in a state of a planning problem. The method comprises running, in a simulation model of the state of a planning problem, a plurality of simulation trials of at least one available top-level action in the state resulting in a simulated reward outcome; and recommending, upon completion of the simulation trials, an action to perform in the state of a planning problem, responsive to the simulated reward outcome obtained in the simulation trials, wherein at least one of the simulation trials performs one or more steps comprising: observing contextual state information in a simulated state; and selecting an available action in the simulated state responsive to said observed contextual state information; wherein a computing system including at least one processor and at least one memory device connected to the processor performs the running, recommending, observing and selecting.

Further to this aspect, each one or more steps of a simulation trial further comprises: estimating an expected reward of at least one available action in the simulated state responsive to the observed contextual state information, wherein the selecting an available action in the simulated state responsive to the observed contextual state information comprises: selecting an available action in the simulated state responsive to its estimated expected reward.

Further to this aspect, each one or more steps of a simulation trial further comprises: observing a simulated reward responsive to a simulated action, and updating simulated reward statistics at the corresponding top-level action in the simulation trial, the computing system further performing the observing and updating.

Further to this aspect, the one or more steps of a simulation trial furthers comprises: simulating a transition to a new state responsive to the selected action, the observed plurality of simulated rewards being responsive to one or more of: the selected action or the state transition.

Further to this aspect, the one or more steps of a simulation trial furthers comprises: maintaining a collection of data pairs comprising observed contextual state information and corresponding observed simulated rewards associated with said selected available action.

Further to this aspect, the estimating the expected reward from the observed contextual state information comprises: implementing, during the one or more steps of a simulation trial, a regression model and calculating a regression fit on the collection of data pairs associated with an available action; estimating one or more of: a mean expected reward or an uncertainty in the mean based on the regression model implemented; and, computing a utility responsive to one or more of: the estimated mean reward or the estimated uncertainty in the mean, wherein the action is selected based on the computed utility.

In a further aspect, there is provided a system for choosing actions in a state of a planning problem. The system comprises: a simulator of the planning problem including at least one processor; and at least one memory device connected to the processor, wherein the processor is programmed to: run, in a simulation model of the state of a planning problem, a plurality of simulation trials of at least one available top-level action in the state resulting in a simulated reward outcome; recommend, upon completion of the simulation trials, an action to perform in the state of a planning problem, responsive to the simulated reward outcome obtained in the simulation trials, wherein the processor is further programmed to perform, in at least one of the simulation trials, one or more steps comprising: observe contextual state information in a simulated state; select an available action in the simulated state responsive to the observed contextual state information.

Further to this aspect, the processor is further programmed to perform, in the one or more steps of a simulation trial: estimating an expected reward of at least one available action in the simulated state responsive to the observed contextual state information, wherein the selecting an available action in the simulated state responsive to the observed contextual state information comprises: selecting an available action in the simulated state responsive to its estimated expected reward.

Further to this aspect, the processor is further programmed to perform, in the one or more steps of a simulation trial: observing a plurality of simulated rewards responsive to a simulated action, and updating simulated reward statistics at the corresponding top-level action in the simulation trial; the processor performing the observing and updating.

Further to this aspect, the processor is further programmed to perform, in the one or more steps of a simulation trial: simulating a transition to a new state responsive to the selected action, the observed plurality of simulated rewards being responsive to one or more of: the selected action or the state transition.

Further to this aspect, in the one or more steps of a simulation trial, the processor is further programmed to: maintain a collection of data pairs comprising observed contextual state information and corresponding observed simulated rewards associated with said selected available action.

Further to this aspect, for estimating the expected reward from the observed contextual state information, the processor is further configured to: implement, during the one or more steps of a simulation trial, a regression model and calculating a regression fit on the collection of data pairs associated with an available action; estimate one or more of: a mean expected reward or an uncertainty in the mean based on the regression model implemented; and, compute a utility responsive to one or more of: the estimated mean reward or the estimated uncertainty in the mean, wherein the action is selected based on the computed utility.

A computer program product is provided for performing operations. The computer program product includes a storage medium readable by a processing circuit and storing instructions run by the processing circuit for running a method. The method is the same as listed above.

BRIEF DESCRIPTION OF THE DRAWINGS

The accompanying drawings are included to provide a further understanding of the present invention, and are incorporated in and constitute a part of this specification.

DETAILED DESCRIPTION

A method, system and computer program product implements the Monte-Carlo planning algorithm in a computing device for providing planning of actions in a real-world environment comprising base state information and contextual state information.

As referred to herein, the "state" of an environment consists of any currently observable information, plus any relevant prior observable information in previous states leading up to the current state, that is relevant to predicting future observed states and future observed rewards. The method, system and computer program product handles domains where part of the observable information may be treated as a base state description, and the remainder of the observable information may be treated as contextual state information amenable to regression techniques for estimating expected cumulative reward.

Figure 2:
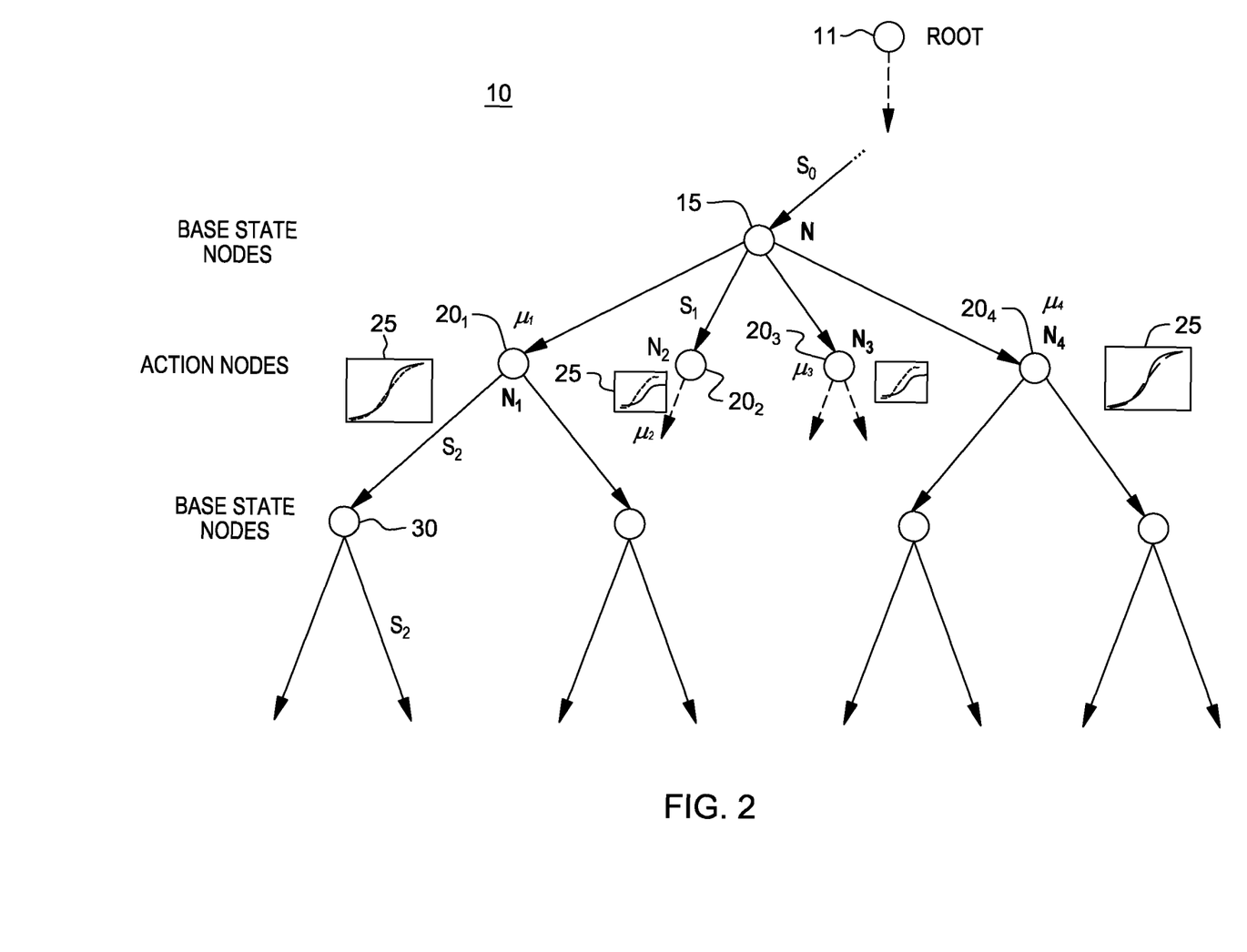
FIG. 2 is an is an exemplary data structure that includes an alternating structure of action nodes and successor base-state nodes for planning in an environment comprising contextual state information in one example embodiment.

FIG. 2 shows the modified Monte-Carlo planning model, in which a data structure 10 is created in a computer system implementing a programmed processor device, the data structure comprising a root node 11 corresponding to the state of a real-world planning problem domain, action nodes (e.g., $20_1, \ldots, 20_4$), denoting available actions in a given simulated state, and base-state nodes (e.g., 15, 30) representing a successor base state reachable by performing an available action in a predecessor base state. For example, node 30 may be reached within a simulation trial by performing action $20_1$ in base state 15. During a given simulation trial, the simulation may generate at each step an observed contextual state (e.g., $s_0, s_1, s_2$), typically represented as a collection of values of one or more discrete or continuous variables.

According to one embodiment, an MCTS-style search is performed in a data structure 10 consisting of a root node 11, which is the entry point for making a decision, i.e., taking an action in a real-world environment. The method includes building from the root node 11, an alternating structure of action nodes, (e.g., nodes $20_1, \ldots, 20_4$), and successor base-state nodes (e.g., 15, 30) such as shown in FIG. 2. In a typical embodiment, the children of action nodes are successor base-state nodes, and the children of successor base-state nodes are action nodes. In addition, as simulation trials are performed for a selected action, each action node accumulates a data set of pairs $\{(s_j, r_j)\}$, where $s_j$ denotes any contextual state information observed at the node on trial j, and $r_j$ denotes the cumulative reward obtained in trial j starting at the node. The cumulative reward value may reflect discounted future rewards. As each sample $(s_j, r_j)$ is accumulated at a node, the node performs incremental batch updating of a regression model R(s) over the entire set $\{(s_j, r_j)\}$ of observed trials, which will be used to estimate expected reward given any observed contextual state "s" on the next trial. That is, through summary data recorded as a result of Monte-Carlo simulations, a regression training is performed following an update of the data set at a node, and a regression manifold is generated and stored as a prediction function 25, e.g., associated with each nodes $20_1, \ldots, 20_4$ resulting from trials of associated branches such as shown in FIG. 2.

Figure 5:
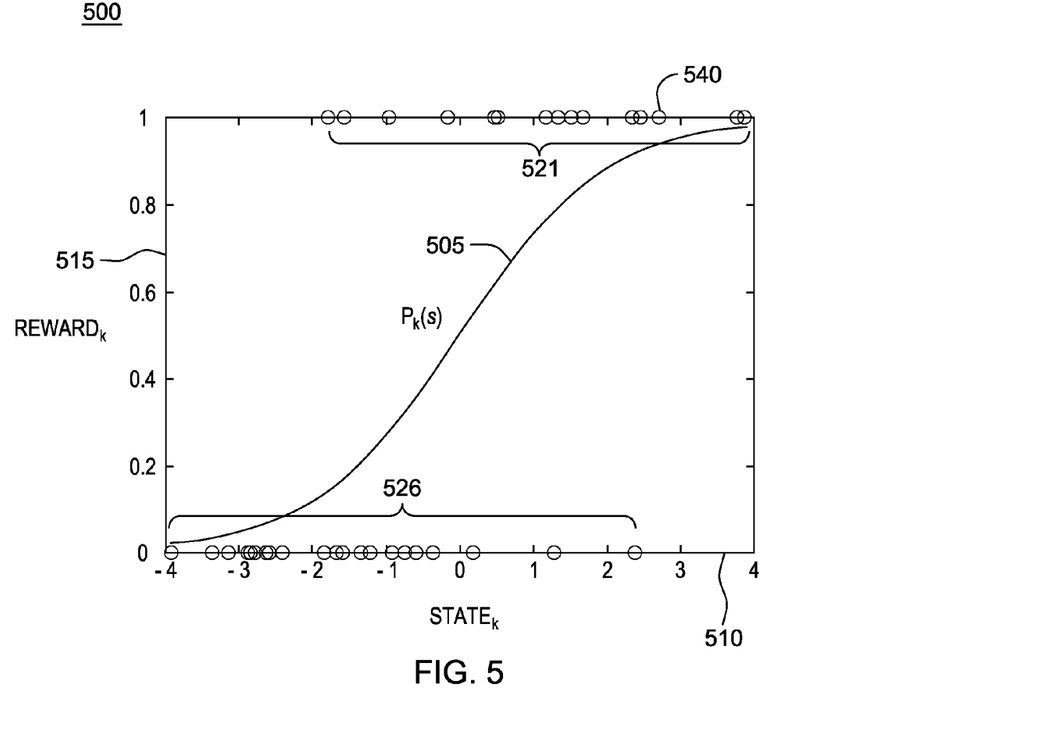
FIG. 5 illustrates an exemplary regression function fitting to a data set in one embodiment.

Given the observed samples and the regression model fits, performance of the next sampling trial operates as follows: The trial begins at the root node 11 of the tree, and descends, in one embodiment, according to a bandit-sampling algorithm to choose action nodes, or a state-transition model to choose successor base-state nodes. In one embodiment, the bandit-sampling algorithm computes for each action i an upper confidence bound $B_i$ on its expected reward (as described herein with respect to formula (1)), and selects the action with highest upper confidence bound. The upper confidence bound $B_i$ is calculated according to:

$$B_i = \mu_i(s) + \sqrt{2 \ln N} \, \text{err}_i(s)$$

where $\mu_i(\ )$ represents a smoothing or regression function (e.g., a function 505 in FIG. 5) that fits to the data set in that action node, s denotes the currently observed contextual state information, $\mu_i(s)$ represents an estimate of the expected reward of that action in that action node given the observation of s, N represents the total number of samples summed over all sibling action nodes, $\text{err}_i(s)$ denotes an uncertainty estimate, i.e., the likely magnitude of difference between the true expected reward of action i and the estimate given by $\mu_i(s)$, and "i" is an index that indicates an identification number of that action node. In the example embodiment depicted in FIG. 2, the selection of an action at node 15 is made by applying formula (1) to each of the sibling action nodes $\{20_1, \ldots, 20_4\}$ (wherein $N=N_1+N_2+N_3+N_4$), and selecting the action with highest resulting value of $B_i$.

Figure 3A:
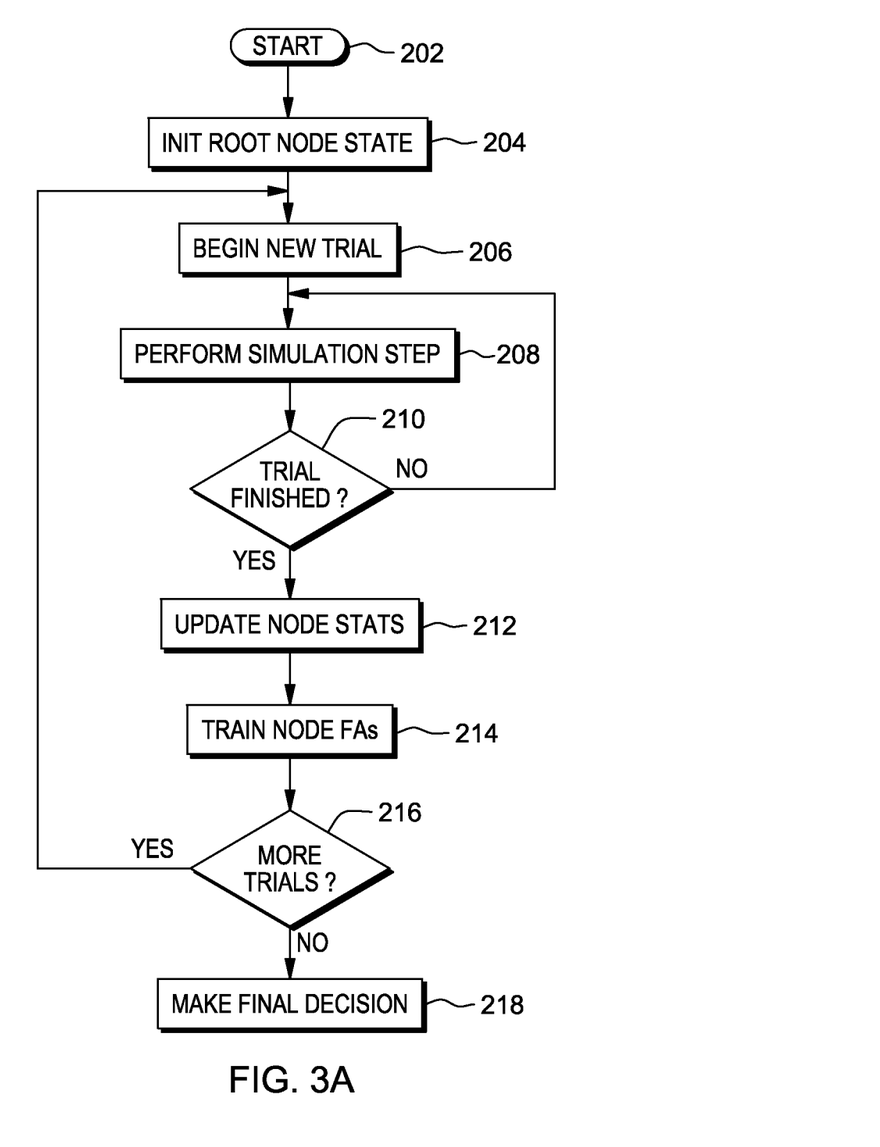
FIG. 3A is a flow chart that describes method steps for performing planning in a real-world environment in one embodiment.
Figure 3B:
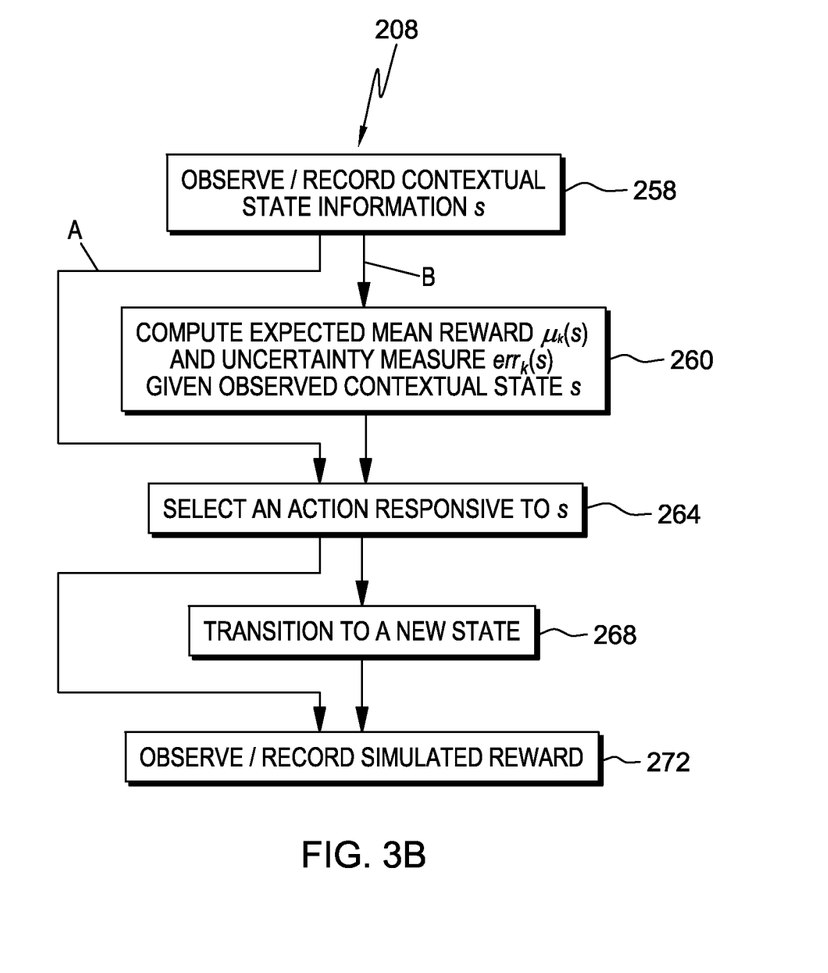
FIG. 3B is a flow chart describing a simulation trial at step 208 performed by a processor device cooperatively operating in conjunction with the implemented simulator of a real-world environment.

FIGS. 3A-3B illustrate steps for performing Monte-Carlo planning in a real-world environment (e.g., a job scheduling environment in which plural program jobs are assigned to run on a limited number of server devices) in one exemplary embodiment. In this exemplary embodiment, there exists a batch of "N" number of jobs (e.g., $J_1, J_2, \ldots, J_N$), e.g., computational tasks to be carried out by a software program, that can be executed on "K" number of server devices. In one embodiment, the server devices are assumed identical and there are no dependencies between jobs. Further it is assumed that the jobs have known distributions of completion time that can be simulated. Further assume a binary reward with value "1" if the time to complete all jobs is less than a specified time deadline "$T_{max}$" else the reward is zero.

One example objective in this exemplary job scheduling embodiment is to configure the computing system to first choose the best set of K jobs to run initially, and then as individual jobs complete at stochastic completion times, to dynamically choose the best job to run next among all the remaining jobs so as to maximize a probability of completing all jobs by $T_{max}$. This is performed by the computing system running method steps 202-218 depicted in FIG. 3A. For example, if K=2 and N=17, the computing system may initially choose job "$J_6$" to run on the first server device, and job "$J_{15}$" to run on the second server device. Assuming that job "$J_{15}$" finishes before "$J_6$" the computing system will then chose an optimal job from the remaining jobs (e.g., a job "$J_7$" to run next on the second server device. In one embodiment, in the modified MCTS tree descent approach, formula (1) is computed for each potential action node and used in choosing a job to run on an idle server device that maximizes the upper confidence value (i.e., the output of the formula (1)).

FIGS. 3A-3B show a method and system for Monte-Carlo planning of actions in the real-world environment. In FIG. 3A, at step 202, the computing system starts to operate. At step 204, the computing system builds and/or initializes a data structure corresponding to a root node of an MCTS-type data structure representing the real-world environment, where the state of the root node of the tree is initialized according to the current state of the live scheduling task, e.g., in one embodiment, a real-world job scheduling environment. The computing system may also be configured to create and initialize a number of intermediate nodes and/or leaf nodes of the MCTS-type data structure representing subsequent base states that may be reached starting from the root-node state in the real-world environment. The computing system may also be configured to create and initialize additional intermediate nodes and leaf nodes while running method steps 208-218 (e.g., created and initialized during execution steps of the trials simulated at 208). The data structure alternates between action nodes, where the computing system is configured to assign jobs to idle servers in the example presented above, and successor state nodes, where a job is completed and a server device becomes available.

After initialization at step 204, the computing system is configured as a simulator or configured to invoke a simulator (running a simulation model) that launches simulation trials at step 206. Each simulation trial includes performing one or more simulation steps run from at least one child node of the root node (node 11 in FIG. 2) that results in an outcome, each of which is performed at step 208. A simulation step comprises a partial descent of the data structure from a node indicating the current state of the simulation (for example, node 15 in FIG. 2) in which one of the available action nodes (e.g., nodes $20_1, \ldots, 20_4$ in FIG. 2) of the current state node (node 15) is selected, and then the simulator (running the simulation model) generates a transition to one of the available successor state nodes (e.g., node 30 in FIG. 2) of the selected action node. Additionally, at each selected action node, the computing system may record a time-stamp data point denoting the current time-to-deadline in a current trial. A simulation step may dynamically add a new action or successor state node(s) to the data structure, for example, upon selecting a child action node that had never been sampled before.

In one embodiment, the method of selecting actions is based on maximizing an upper confidence bound value over possible actions, as described herein with respect to formula (1). In an alternate embodiment, the computing system leverages Interval Estimation (L. P. Kaelbling, *Learning in Embedded Systems*, MIT Press, 1993) to select a child action node.

To simulate real environment in which decisions have to be made and there is some set of possible decisions, a simulator device, comprising a programmed processor having operatively associated memory for data storage, implements a simulation model of the real-world environment being modeled. The simulation model of the real-world environment is capable of performing a simulated trial starting from a given starting state of the environment and provides a reasonably accurate simulation of the temporal effects of using a given decision-making policy starting from the initial state, in terms of what sequences of state transitions and rewards ensue. That is, an MCTS-type approach implements the traversal of the tree structure from the initial (current) state (comprising initial base state plus initial contextual state), e.g., a root node 11, through a sequence of simulations steps, each step comprising selection of an action node shown, and simulating a transition, e.g., a non-deterministic transition, to get to a new state, comprising a new base state and a new contextual state.

FIG. 3B is a flow chart describing steps 208 of a simulation trial launched at 206 that are performed by a processor device operating in conjunction with the implemented simulator running a simulation model of a real-world environment. In some embodiments, a simulation trial launched at 206 comprises execution of plural steps, one or more of which includes recording an observation of contextual state information s as indicated at 258. An example of observed contextual state information may include, for example, an amount of time that has elapsed in transitioning from a prior state. General embodiments of the invention will then proceed to step 264, as indicated in a first processing path A, to compute a selected action responsive to the observed contextual state information s. The specific mechanism for performing the computation may vary in different embodiments. For example, one embodiment of the invention utilizes an intermediate step 260, as shown in a second processing path B, wherein an expected mean reward and an expected uncertainty measure are computed from the observed contextual state information, and then at step 264, selecting an action responsive to the observed contextual state information comprises selecting an action responsive to the computed expected mean reward and uncertainty measure.

Upon completion of step 264, general embodiments of the invention will then record at step 272 an observed simulated reward responsive to the selected action, such that upon completion of the simulation trials, there is recommended an action to perform in the state of a planning problem, corresponding to the top-level root node state in the simulated trials, wherein the recommended action is responsive to the simulated reward outcome obtained in the simulation trials. An additional embodiment may additionally incorporate a step 268 wherein the simulator (running the simulation model) generates a transition to one of the available successor states of the action selected at 264, wherein the observed simulated reward at 272 is responsive to one or more of: the selected action, and the simulated state transition.

Referring back to FIG. 3A, during the simulation, at 208, the computing system maintains a collection of nodes (e.g., data structure 10 in FIG. 2) corresponding to observed base states that have been encountered. Nodes are uniquely identified by values of the base-state variables, so that two observations of identical base-state variable values are grouped together within a single node. In one embodiment, as shown in FIG. 2, whenever a node is encountered during simulation trial j, the computing system maintains a record $(s_j, r_j)$ of data observed in the node, where $s_j$ denotes contextual state information in the $j^{th}$ trial, and depending on a planning objective, $r_j$ is either an observed immediate reward or an observed cumulative reward obtained starting from the node "N." In the latter case, any subsequent rewards obtained in subsequent states of the trial are added to the value of $r_j$. The values added to $r_j$ may be multiplied by $\gamma^d$, where $\gamma$ denotes a discount parameter, lying in the range [0,1], and d is an integer denoting the delay (measured in number of discrete decision intervals) of the subsequent rewards.

After running the simulation step 208, the computing system is configured to decide at step 210 whether to perform additional steps in this simulation trial. If more simulations are required, e.g., there is no final determination, the process continues performing simulations of that trial at step 208. For example, in this job scheduling environment, a simulation trial continues until a final reward is obtained, either by completing all jobs before the time deadline (reward value=1), or by exceeding the time deadline without completing all jobs (reward value=0). Upon a completion of a simulation trial, the computing system is configured to proceed to step 212, where statistics (e.g., the above-mentioned $\{(s_j, r_j)\}$ data set) maintained for nodes participating in said simulation trial are updated. For example, this updating results in storing a data pair $(s_{jk}, r_{jk})$ at each action node "k" that participated in a simulation trial "j", where "$s_{jk}$" is the contextual state information, i.e., a time stamp recorded at the node "k" in the simulation trial "j", and "$r_{jk}$" denotes the cumulative simulated reward (corresponding to the final reward in the jobs scheduling task) obtained in the simulation trial "j" starting at node "k".

Thus, in the example job/server scheduling problem, there may be 5 server devices (computing machines) and all machines are currently busy handling jobs. Jobs $J_2, J_3, J_5,$ and $J_9$ remain to be processed. Amongst all jobs currently running, in an example real-world environment, a job that finishes first will free up its server, e.g., server 2, in which case job $J_5$ may be assigned to that server. In this example, an action includes selecting a remaining job to run on an available server, and a state transition comprises the completion of one or more jobs, with the corresponding servers becoming available. When a transition takes place, a certain amount of time has elapsed, represented as contextual state information (e.g., denoted "t". Thus, every time in the above exemplary state that server 2 becomes free and $J_5$ is assigned, a simulator implementing a simulation model, may perform this simulation many times, with different elapsed time t in each trial. The elapsed times and corresponding rewards (meeting job deadline or not) are output of the simulation model and stored as data pairs within the corresponding node. As shown in FIG. 5, there is provided a graphic representation 500 of the summary statistics, e.g. contextual state information 510 (e.g., elapsed time "t" in the example) shown plotted on the x-axis and the reward 515 (e.g., probability of completing job) plotted on y-axis, for association with node k. In the example, the reward is binary: either the trial resulted in meeting job deadline (e.g., data set pairs 521) or the trial resulted in not meeting job deadline (e.g., data set pairs 526).

Thus, referring to FIG. 2, given the example job/server scheduling task at node N, base-state information is maintained in the MCTS tree structure, (e.g., which server machine is free of the five server machines) and, contextual state information is maintained at each node of the MCTS tree, e.g., elapsed time t. Both types of information are used to determine what action to take given the current state.

The simulator invoked at each trial generates the elapsed time as modeled in the simulator. The simulator is assumed to have a good simulation model that is faithful to the real domain within an acceptable degree of accuracy. The simulator receives observed values (pertaining to the starting state in the real domain); simulates various subsequent state transitions; and generates simulations of contextual state variables associated with those state transitions.

Thus, given a current state of a real-world environment, the simulator receives input including given observed values in the real domain and simulates subsequent state transitions including simulated contextual state variables (and base-state variable) associated with those state transitions. It is understood that the contextual state information may comprise a single variable, many variables, or in general, instances of data drawn from a general metric space.

Referring back to FIG. 3A, the computing system is then configured to proceed to 214 where the method includes training of a value function approximator (FA) at one or more nodes based on a plurality of recorded data pairs $\{(s_{jk}, r_{jk})\}$ stored at a given node. That is, given accumulated stored data pairs $\{(s_{jk}, r_{jk})\}$ recorded at an action node "k", a regression fit to the stored summary statistics data accumulated at the node is performed. This function is represented as a function "$P_k(s)$", e.g., a smooth function 505 such as shown in FIG. 5.

FIG. 5 particularly illustrates an exemplary graph 500 that shows an exemplary regression function 505 that fits to a data set accumulated at an action node in one embodiment. The data set may include a plurality of pairs of contextual state information 510 and an observed reward value 515. The computing system fits the regression function 505 to the data set, e.g., by using a programmed regression technique that includes, but is not limited to techniques known in the art (e.g., linear regression, logistic regression, spline regression, regression trees, etc.) as well as various loss functions known in the art (e.g., mean-squared error, cross-entropy error, etc.). For example, linear regression approximates a relationship between the contextual state information 510 and the observed reward 515 by using a linear formula. Logistic regression predicts a probability of occurrence of an event (e.g., an occurrence of an observed reward) by fitting the data set to a logistic function curve (i.e., the smoothing function 505). The method of spline regression imposes a uniform partition on the input state space, and fits simple functions (e.g., linear or quadratic functions) to the observed samples in each partition, subject to continuity and smoothness constraints across adjacent partitions. A regression tree, for example, approximates a real-valued function by recursively partitioning the input state space, and then fitting a simple function (for example, a constant function) to the observed samples in the leaf node partitions.

Thus, for the example job/server scheduling task, during any given trial, as the MCTS algorithm executes steps descending down the tree, there is observed at each step of the trial an elapsed time, t', output from the simulator. Thus, given the regression curves, the estimates received from the regression model at each trial (simulation) are used in the upper bound calculation of formula (1): a mean, $\mu_i(t')$ and uncertainty measure, $err_i(t')$. Thus, for the example shown in FIG. 2, the function $\mu_i(\ )$ denotes the form of the regression curve 25 at the action node $20_k$, and t' is the specific value of input contextual state (e.g., on the t-axis) of the regression curve to obtain an expected reward value (and similarly for action nodes 2, 3, 4 etc.). To measure uncertainty in mean value based on regression analysis, an error propagation technique is employed in one embodiment.

For example, in one embodiment, the uncertainty in expected reward (e.g., $err_i(t')$ is computed from standard errors of regression parameter values in the formula (1), e.g., the fitted coefficients a and b in a linear regression model y=ax+b according to Gaussian error propagation technique. According to this technique, the uncertainty in expected reward $err_i(t')$ is calculated as sqrt($\sigma_a^2 x^2 + \sigma_b^2$), where $\sigma_a$ and $\sigma_b$ are respectively the standard errors in estimates of the linear regression parameters a and b.

In another embodiment, the uncertainty in expected reward $err_i(t)$ is obtained by temporarily adding a fictitious data point (s, r*) to the node's set of data pairs, where s is the observed state of contextual variables, and r* is the maximum possible reward that could be obtained in any trial. Such data point, for example, is shown in FIG. 5, plotted as data pair 540 that represents an additional observed contextual state datum during a simulated trial on the action node that includes the data. The system then performs re-training the regression model on the augmented data set, and using the difference between new expected reward and previous expected reward to determine the uncertainty estimate. For example, for the job/server scheduling task, given the example regression curve of FIG. 5, when estimating the chance of meeting the deadline when deciding what action (node) to select next, there is added to the accumulated (stored) data pairs an additional data point $(s_{jk}, 1)$ and then the regression curve is recalculated. The degree to which the curve shifts after re-training the FA curve on the new value added to the data set is taken as measure of the uncertainty (i.e., an estimation of $err_i(t')$ at that node when deciding what action to take. For example, the computing system calculates a difference between the originally estimated expected reward and the re-calculated expected reward. In this embodiment, the calculated difference is the uncertainty estimate, $err_i(s)$ in the formula (1).

As an alternative to configuring the computing system to fit the value function (FA) to the updated statistics using a regression technique, the computing system is programmed to alternatively train the value function approximator via: a fast online learning method (e.g., stochastic gradient method) used for training parameterized regression models (e.g., logistic regression), or a fast incremental batch learning method used to train non-parametric regression models (e.g., regression trees).

In either embodiment, the output of the value function approximator (represented as a fitted regression function 505) is an estimate of an expected reward, i.e. $\mu_i(s)$ in formula (1), that can be obtained when the computing system selects a particular action node. The node selection may be additionally responsive to the uncertainty estimate of the expected reward, i.e., $err_i(s)$ in the formula (1). For the example job/server scheduling of FIG. 2, a logistic function of type depicted in 505 provides an estimate of an expected reward that can be obtained when the computing system selects a particular action node at any possible value T of time remaining. For example, the function is used to estimate the expected probability of success at the node "k" at any possible value "T" of time remaining, i.e., estimate a probability of completing remaining jobs within "T" by taking an action specified in the node "k". In an alternate embodiment, an uncertainty measure may be converted into an equivalent amount of trials "N" at a node (e.g., adding to the degree of confidence of reward estimate).

Returning to FIG. 3A, after completing training of the value function approximator at step 214, the computing system is configured to proceed to step 216, where a choice is made to either terminate the simulation, or return to step 206 to perform additional simulation trials starting from the root node state. In one embodiment, a termination criterion may be based on total elapsed simulation CPU time exceeding a threshold value. In another embodiment, the computing system is configured to compute an expected regret of the current best top-level decision, and the simulation terminates when the expected regret drops below a threshold value (e.g., 0.005). The expected regret is defined as the expected difference between the "true" best payoff rate (which would be known exactly if it were possible to perform an infinite number of simulation trials) and the payoff rate of the selected top-level action. Given payoff distributions of all top-level actions, the expected regret of any top-level action can be calculated according to established methods that are known in the art.

If the termination criteria of 216 are met, the computing system is configured to proceed to step 218. In step 218, the computing system recommends a top-level action (selection of a child node of the root node) that maximizes the expected mean reward. In the case of the example job-scheduling task, this selected top-level action is then executed in the real domain until such time as another scheduling decision is needed later in the task. This specified action may include selecting a particular server device for a particular job and then the computing system may be configured to continue to run method steps 202-218 in FIG. 2 to compute each job assignment decision until all the remaining jobs are assigned to available server devices.

A computing system (e.g., a computing system 300 in FIG. 4) runs method steps of a method 200 depicted in FIG. 3A, with a recommendation provided, e.g., by displaying via a user interface, to make a decision (perform an action) within a decision cycle (e.g., a predetermined amount of time) or sequence of decisions (i.e., an entire action plan over successive decision cycles) in a real-world environment. Alternatively, the computing system may leverage a search algorithm (e.g., a binary search tree technique, a Monte-Carlo Tree Search (MCTS) technique, etc.) to make decision(s) in a real-world environment.

In sum, in the modified MCTS approach, a tree is constructed with a finite and manageable number of nodes, while utilizing contextual state information in the domain to estimate reward via methods for function approximation based on fast incremental batch training. Use of the actual contextual state information renders a problem at hand more tractable and provides inference over similar values of the contextual state which can be reasonably expected to provide similar values of the objective function (i.e., reward).

Examples of real-world stochastic (i.e., a non-deterministic) environments in which contextual state information are modeled in the MCTS data structures, includes, but are not limited to: a network packet routing and scheduling system, a supply chain management system, a battlefield planning system, an urban traffic management system, a resource allocation system, an autonomic computing system (i.e., self-improving and self-managing computing system), a system for medicine trials, a system for consumer marketing, a trading system in a financial market, other real-world activity, a computer game, etc.

Figure 4:
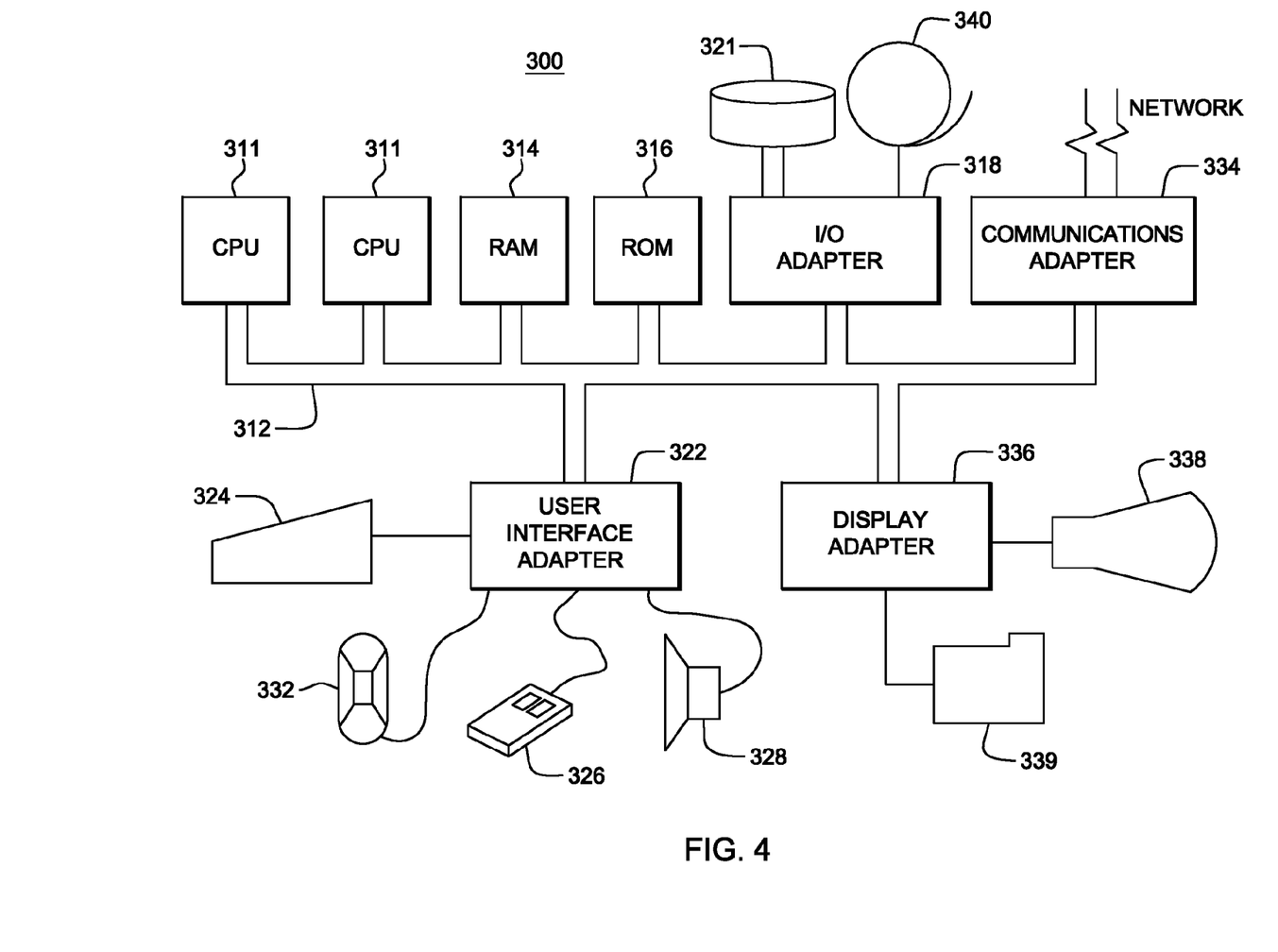
FIG. 4 illustrates an exemplary hardware configuration to run method steps described in FIGS. 2, 3A and 3B in one embodiment.

FIG. 4 illustrates an exemplary hardware configuration of the computing system 300. The hardware configuration preferably has at least one processor or central processing unit (CPU) 311. The CPUs 311 are interconnected via a system bus 312 to a random access memory (RAM) 314, read-only memory (ROM) 316, input/output (I/O) adapter 318 (for connecting peripheral devices such as disk units 321 and tape drives 340 to the bus 312), user interface adapter 322 (for connecting a keyboard 324, mouse 326, speaker 328, microphone 332, and/or other user interface device to the bus 312), a communication adapter 434 for connecting the system 300 to a data processing network, the Internet, an Intranet, a local area network (LAN), etc., and a display adapter 336 for connecting the bus 312 to a display device 438 and/or printer 339 (e.g., a digital printer of the like).

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with a system, apparatus, or device running an instruction. The containment (or storage) of the program may be non-transitory.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with a system, apparatus, or device running an instruction.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may run entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which run via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which run on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more operable instructions for implementing the specified logical function(s). It should also be noted that, in some alternative implementations, the functions noted in the block may occur out of the order noted in the figures. For example, two blocks shown in succession may, in fact, be run substantially concurrently, or the blocks may sometimes be run in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A method for choosing actions in a current state of a planning problem, the method comprising:

partitioning a representation of states of a planning problem into a base state representation and a contextual state representation, said contextual state representation providing contextual variables configurable for a regression analysis;

running, in a simulation model of said current state of a planning problem, a plurality of simulation trials initiated from at least one available top-level action in said current state resulting in a simulated reward outcome, wherein at least one of said plurality of simulation trials performs one or more simulation steps, a simulation step comprising:

simulating a reward outcome resulting from a simulated action in a simulated state comprising a simulated base state and a simulated contextual state;

forming a regression data pair associated with said simulated action in said simulated base state, said regression data pair comprising said simulated contextual information and said simulated reward outcome;

training a regression model associated with said simulated action in said simulated base state by calculating a regression fit on one or more regression data pairs associated with said simulated action; said regression model estimating a mean expected reward as a function of said simulated contextual state and an uncertainty in the mean, wherein said estimating an uncertainty in the mean comprises:

temporarily adding to said one or more associated regression data pairs an additional data pair comprising current contextual state information and a maximal reward value;

re-calculating said regression fit on said associated regression data pairs using said trained regression model;

re-estimating said mean expected reward according to said re-calculated regression fit; and estimating said uncertainty in the mean according to a difference between the original mean expected reward and the re-calculated mean expected reward; and computing a utility responsive to said estimated mean reward and said estimated uncertainty in the mean;

selecting an action from available actions in said simulated state comprising said simulated base state and simulated contextual state based on said computed utility; and recommending, upon completion of said simulation trials, an action to perform in said current state of a planning problem, responsive to said simulated reward outcome obtained in said simulation trials, wherein a computing system including at least one processor and at least one memory device connected to the processor performs the partitioning, running, simulating, forming, training, estimating selecting, and recommending.

2. The method according to claim 1, wherein said simulation trial further performs:
observing a plurality of simulated reward outcomes responsive to a simulated action, and
updating simulated reward statistics at the corresponding top-level action in said simulation trial.

3. The method according to claim 2, wherein said simulation step further comprises:
simulating a transition to a new simulated state responsive to said selected action, said observed plurality of simulated reward outcomes being responsive to one or more of: the selected action or said state transition.

4. The method according to claim 1, wherein selecting an action based on said computed utility comprises computing said utility for a plurality of available actions, and selecting an action with a maximum computed utility.

5. The method according to claim 3, wherein said observed plurality of simulated reward outcomes comprises: an immediate reward observed upon said simulating a transition to said new simulated state, or a cumulative reward further comprising observed simulated reward outcomes in subsequent steps of said simulation trial.

6. A system for choosing actions in a current state of a planning problem, the system comprising:
a simulator of the planning problem including at least one processor; and
at least one memory device connected to the processor, wherein the processor is programmed to:
partition a representation of states of a planning problem into a base state representation and a contextual state representation, said contextual state representation providing contextual variables configurable for a regression analysis;
run, in a simulation model of said current state of a planning problem, a plurality of simulation trials initiated from at least one available top-level action in said current state resulting in a simulated reward outcome, wherein at least one of said plurality of simulation trials performs one or more simulation steps, a simulation step comprising:
simulating a reward outcome resulting from a simulated action in a simulated state comprising a simulated base state and a simulated contextual state;
forming a regression data pair associated with said simulated action in said simulated base state, said regression data pair comprising said simulated contextual information and said simulated reward outcome;
training a regression model associated with said simulated action in said simulated base state by calculating a regression fit on one or more regression data pairs associated with said simulated action; said regression model estimating a mean expected reward as a function of said simulated contextual state and an uncertainty in the mean, wherein said estimating an uncertainty in the mean comprises:
temporarily adding to said one or more associated regression data pairs an additional data pair comprising current contextual state information and a maximal reward value;
re-calculating said regression fit on said associated regression data pairs using said trained regression model;
re-estimating said mean expected reward according to said re-calculated regression fit; and
estimating said uncertainty in the mean according to a difference between the original mean expected reward and the re-calculated mean expected reward; and
computing a utility responsive to said estimated mean reward and said estimated uncertainty in the mean;
selecting an action from available actions in said simulated state comprising said simulated base state and simulated contextual state based on said computed utility; and
said processor further configured to:
recommend, upon completion of said simulation trials, an action to perform in said current state of a planning problem, responsive to said simulated reward outcome obtained in said simulation trials.

7. The system according to claim 6, wherein the processor is further programmed to perform, in a simulation trial:
observing a plurality of simulated reward outcomes responsive to a simulated action, and
updating simulated reward statistics at the corresponding top-level action in said simulation trial.

8. The system according to claim 7, wherein the processor is further programmed to perform at said simulation step:
simulating a transition to a new simulated state responsive to said selected action, said observed plurality of simulated reward outcomes being responsive to one or more of: said selected action or said state transition.

9. The system according to claim 6, wherein selecting an action based on said computed utility comprises computing said utility for a plurality of available actions, and selecting an action with a maximum computed utility.

10. The system according to claim 8, wherein the observed plurality of simulated reward outcomes comprises: an immediate reward observed upon said simulating a transition to said new simulated state, or a cumulative reward further comprising observed simulated reward outcomes in subsequent steps of said simulation trial.

11. A computer program product for choosing actions in a current state of a planning problem, the computer program product comprising a non-transitory computer readable medium, said medium readable by a processing circuit and storing instructions run by the processing circuit for performing a method, the method comprising:
partitioning a representation of states of a planning problem into a base state representation and a contextual state representation, said contextual state representation providing contextual variables configurable for a regression analysis;
running, in a simulation model of said current state of a planning problem, a plurality of simulation trials initiated from at least one available top-level action in said current state resulting in a simulated reward outcome, wherein at least one of said plurality of simulation trials performs one or more simulation steps, a simulation step comprising:
simulating a reward outcome resulting from a simulated action in a simulated state comprising a simulated base state and a simulated contextual state;
forming a regression data pair associated with said simulated action in said simulated base state, said regression data pair comprising said simulated contextual information and said simulated reward outcome;
training a regression model associated with said simulated action in said simulated base state by calculating a regression fit on one or more regression data pairs associated with said simulated action; said regression model estimating a mean expected reward as a function of said simulated contextual state and an uncertainty in the mean, wherein said estimating an uncertainty in the mean comprises:
    temporarily adding to said one or more associated regression data pairs an additional data pair comprising current contextual state information and a maximal reward value;
    re-calculating said regression fit on said associated regression data pairs using said trained regression model;
    re-estimating said mean expected reward according to said re-calculated regression fit; and
    estimating said uncertainty in the mean according to a difference between the original mean expected reward and the re-calculated mean expected reward; and
computing a utility responsive to said estimated mean reward and said estimated uncertainty in the mean;
selecting an action from available actions in said simulated state comprising said simulated base state and simulated contextual state based on said computed utility; and
recommending, upon completion of said simulation trials, an action to perform in said current state of a planning problem, responsive to said simulated reward outcome obtained in said simulation trials.

12. The computer program product according to claim 11, wherein said simulation trial further performs:
observing a plurality of simulated reward outcomes responsive to a simulated action, and
updating simulated reward statistics at the corresponding top-level action in said simulation trial.

13. The computer program product according to claim 12, wherein said simulation step further comprises:
simulating a transition to a new simulated state responsive to said selected action, said observed plurality of simulated reward outcomes being responsive to one or more of: said selected action or said state transition.

14. The computer program product as claimed in claim 11, wherein selecting an action based on said computed utility comprises computing said utility for a plurality of available actions, and selecting an action with a maximum computed utility.

15. The computer program product as claimed in claim 13, wherein said observed plurality of simulated reward outcomes comprises: an immediate reward observed upon said simulating a transition to a new state, or a cumulative reward further comprising observed simulated reward outcomes in subsequent steps of said simulation trial.

16. A method for assigning of a plurality of jobs to a plurality of compute server devices adapted for running said jobs, said assigning of jobs comprising:
constructing a data structure representing states of a job allocation environment,
partitioning a representation of a state of a job allocation environment into a base state representation and a contextual state representation; said base state representation of the data structure including one or more nodes specifying a state of job assignments to said compute server devices of said plurality, said jobs having known distributions of completion times, and one or more nodes specifying available actions in said state, said contextual state representation providing contextual variables configurable for a regression analysis;
simulating, in a plurality of trials, a model of said job allocation environment, wherein at least one of said plurality of simulation trials performs one or more simulation steps, a simulation step comprising:
    simulating a reward outcome resulting from a simulated action in a simulated state comprising a simulated base state and a simulated contextual state, an action defined as assigning and running a current available job on an available compute server
    forming a regression data pair associated with said simulated action in said simulated base state, said regression data pair comprising said simulated contextual information and said simulated reward outcome;
    training a regression model associated with said simulated action in said simulated base state by calculating a regression fit on one or more regression data pairs associated with said simulated action; said regression model estimating a mean expected reward as a function of said simulated contextual state and an uncertainty in the mean, wherein said estimating an uncertainty in the mean comprises:
        temporarily adding to said one or more associated regression data pairs an additional data pair comprising current contextual state information and a maximal reward value;
        re-calculating said regression fit on said associated regression data pairs using said trained regression model;
        re-estimating said mean expected reward according to said re-calculated regression fit; and
        estimating said uncertainty in the mean according to a difference between the original mean expected reward and the re-calculated mean expected reward; and
    computing a utility responsive to said estimated mean reward and said estimated uncertainty in the mean;
    selecting an action from available actions in said simulated state comprising said simulated base state and simulated contextual state based on said computed utility; and
wherein said simulation step includes performing a descent of the data structure comprising said selecting an available action, and transitioning to a new base state node and a new contextual state, wherein a base state transition represents a completion of a currently assigned job resulting in a server device becoming available, and a new contextual state represents an amount of time t remaining for completing assignments of all said plurality of jobs before an imposed time limit;
and wherein a simulation trial further comprises:
outputting data from each participating node in said simulation trial, said data comprising said time remaining t in said simulation trial at said node, and a corresponding final reward value in said simulation trial for storage in a data structure associated with the node in a memory device; and
processing, at each node, said output data to obtain said mean estimate of the expected reward and uncertainty in the mean based on a model trained by said simulation job allocation environment model outputs; and,
recommending, based on said final reward values in said simulated trials, an individual compute server to run each of the plural jobs, and then as individual jobs complete at stochastic completion times, dynamically choosing a job to run next among all the remaining jobs so as to maximize a probability of completing all jobs by said imposed time limit,
wherein a computing system including at least one processor and at least one memory device connected to the processor performs the constructing, partitioning, model simulating, outputting, processing and recommending.

* * * * *